United States Patent
Chen et al.

(10) Patent No.: US 7,491,592 B2
(45) Date of Patent: Feb. 17, 2009

(54) THIN FILM TRANSISTOR DEVICE WITH HIGH SYMMETRY

(75) Inventors: Po-Chu Chen, Hsinchu (TW); King-Yuan Ho, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 143 days.

(21) Appl. No.: 11/544,652

(22) Filed: Oct. 10, 2006

(65) Prior Publication Data

US 2007/0215942 A1 Sep. 20, 2007

(30) Foreign Application Priority Data

Mar. 17, 2006 (TW) ............................... 95109112 A

(51) Int. Cl.
*H01L 21/00* (2006.01)
(52) U.S. Cl. ................ 438/164; 438/166; 257/E21.411
(58) Field of Classification Search ................ 438/164, 438/166, 184; 257/347, 797, E21.411
See application file for complete search history.

(56) References Cited

U.S. PATENT DOCUMENTS

| | | | | |
|---|---|---|---|---|
| 6,521,473 B1 | 2/2003 | Jung | | |
| 6,764,886 B2 * | 7/2004 | Yamazaki et al. | ........... | 438/164 |
| 6,921,686 B2 * | 7/2005 | Kusumoto et al. | .......... | 438/161 |
| 6,979,605 B2 * | 12/2005 | Yamazaki et al. | ........... | 438/166 |
| 7,279,372 B2 * | 10/2007 | Yamazaki et al. | ........... | 438/164 |
| 2003/0215973 A1 * | 11/2003 | Yamazaki et al. | ............. | 438/48 |
| 2003/0235971 A1 * | 12/2003 | Yamazaki et al. | ........... | 438/487 |
| 2005/0009251 A1 * | 1/2005 | Yamazaki et al. | ........... | 438/151 |
| 2006/0079041 A1 * | 4/2006 | Yamazaki et al. | ........... | 438/166 |
| 2006/0134886 A1 * | 6/2006 | Yamazaki et al. | ........... | 438/463 |
| 2007/0243670 A1 * | 10/2007 | Chen et al. | .................. | 438/149 |

* cited by examiner

*Primary Examiner*—Michael S Lebentritt
(74) *Attorney, Agent, or Firm*—Birch, Stewart, Kolasch & Birch, LLP

(57) ABSTRACT

A thin film transistor device with high symmetry is disclosed, in which the symmetrical structure of transistor is utilized to enable currents flowing in the channels of each transistor formed on a polysilicon film of a specific crystallization direction to pass the same amount of grain boundaries, thereby improving the uniformity of electrical characteristics of the device. By the thin film transistor device of the invention, not only the freedom of circuit design is increased, but also the circuit area of a TFT device occupied is reduced.

28 Claims, 6 Drawing Sheets

THIN FILM TRANSISTOR DEVICE WITH HIGH SYMMETRY

FIELD OF THE INVENTION

The present invention relates to a thin film transistor (TFT) device, and more particularly, to a TFT device with high symmetry capable of overcoming the non-uniformity of electrical characteristics in a TFT array formed on a polycrystalline silicon film with a specific crystallization direction by passing through the same amount of grains.

BACKGROUND OF THE INVENTION

Polycrystalline silicon (p-Si) and amorphous silicon (a-Si) are often used as the active layer material for thin film transistors (TFTs) in liquid crystal display (LCD); devices. Since amorphous silicon (a-Si) can be deposited at a low temperature to form a thin film on a glass substrate, amorphous silicon (a-Si) is commonly used in liquid crystal displays (LCD). Unfortunately, amorphous silicon (a-Si) TFTs have relatively low carrier mobility that limit their suitability for large area LCD. In contrast, polycrystalline silicon TFTs provide much faster carrier mobility. Thus, polycrystalline silicon (p-Si) is well suited for use in large LCD devices.

One method of crystallizing amorphous silicon into polycrystalline silicon is sequential lateral solidification (SLS), which can be used to form a polycrystalline silicon film with carrier mobility better than that formed by conventional excimer laser annealing (ELA). Therefore, in the interest of enhanced carrier mobility, low temperature polycrystalline silicon thin film transistor (LTPS TFT) formed by SLS technology has been used commonly in the application of System-on-Panel (SOP).

As a polycrystalline silicon film is attained by SLS silicon crystallization, the poly-silicon grains have the same orientation. Thus, if the channel directions of the TFT devices of an LCD device formed on the SLS-crystallized poly-silicon film are different to each other, the number of silicon grain boundaries exist on the carrier paths in different TFT devices are different, such that the electrical characteristic of the LCD panel fabricated thereby is irregular. Therefore, it is general to design the TFT devices following a same channel direction. However, by doing so, the freedom of circuit design is limited.

Please refer to FIG. 1, which shows a polycrystalline silicon film 10 having silicon grains to be grown by SLS technology on a slant relative to the horizontal direction of a substrate with a predetermined angle degree, being disclosed in U.S. Pat. No. 6,521,473. As seen in FIG. 1, when the growth direction of silicon grains is on a slant relative to the horizontal direction of the substrate at an angle of about 45 degree, the number of grain boundaries inside the TFT device 12, in which the channel direction is horizontal to the substrate, is the same as that of the TFT device 12', in which the channel direction is perpendicular to the substrate, the result is that the electrical characteristic of the TFT device 12 is the same as that of the TFT device 12', and thus the electrical irregularity can be prevented. However, the TFT devices can have uniform carrier mobility among the devices only when they are oriented either horizontal or perpendicular to the substrate.

Therefore, different from the aforesaid concept of growing silicon grains following a predetermined angle degree by SLS technology, it is intended to provide a thin film transistor device with high symmetry, in which the symmetrical structure of the TFT devices is utilized to enable the number of silicon grain boundaries exist on the carrier paths in different TFT devices to be the same, thereby not only the freedom of circuit design is increased since the orientation of the TFT devices are not limited, but also the circuit area of a TFT device occupied is reduced.

SUMMARY OF THE INVENTION

It is the primary object of the present invention to provide a thin film transistor device with high symmetry, which can be manufactured by a process compatible to the manufacturing process of any prior-art transistor without increasing the complexity thereof, and can Co be used for overcoming the non-uniformity of electrical characteristics in a TFT array formed on a polycrystalline silicon film with some specific crystallization direction.

It is another object of the invention to provide a layout design for a device, that not only the freedom of circuit design is increased, but also the circuit area of the device occupied is reduced.

To achieve the above objects, the present invention provides a thin film transistor device with high symmetry, which comprises: a substrate; a polycrystalline silicon film, formed on the substrate, having a plurality of silicon grains oriented in a specific crystallization direction; and a plurality of transistors, each including a source region, a drain region and a channel region formed on the polycrystalline silicon film; wherein, the channel region is substantially a symmetric pattern sandwiched between the source region and the drain region for enabling the number of silicon grain boundaries exist on each channel region of the plural transistors to be the same.

Preferably, the polycrystalline silicon film is formed by the use of a sequential lateral solidification (SLS) process.

Preferably, no matter the carrier paths of the channel regions of such transistors are parallel with, perpendicular to, or are inclined at any angle with respect to the grain boundary, the electrical characteristics of such transistor are the same.

Other aspects and advantages of the present invention will become apparent from the following detailed description, taken in conjunction with the accompanying drawings, illustrating by way of example the principles of the present invention.

DESCRIPTION OF THE PREFERRED EMBODIMENT

For your esteemed members of reviewing committee to further m understand and recognize the fulfilled functions and structural characteristics of the invention, several preferable embodiments cooperating with detailed description are presented as the follows.

During the manufacturing of a thin film transistor device with high symmetry according to a preferred embodiment of the invention, a layer of amorphous silicon (a-Si) film is first being deposited on a glass or quartz substrate by a means of sputtering or low pressure chemical vapor deposition (LP-CVD); and then the a-Si film is converted into a polycrystalline silicon film by a means of sequential lateral solidification (SLS) for growing silicon grains following a single direction.

As those disclosed in prior art, if the channel directions of the TFT devices of an LCD device formed on the SLS-crystallized silicon film are different to each other, that is, some TFTs are formed with channel directions parallel to the crystallization direction while others are formed with channel directions perpendicular to the crystallization direction, the number of silicon grain boundaries exist on the carrier paths in different TFT devices are not the same, such that the electrical characteristic of the LCD panel fabricated thereby is irregular and thus is inferior. Therefore, the transistors of the present invention are designed with a highly symmetrical layout so as to enable currents flowing in the channels of each transistor formed on a polycrystalline silicon film of some specific crystallization direction to pass the same amount of grain boundaries, thereby improving the uniformity of electrical characteristics of the device. By the thin film transistor device of the invention, not only the freedom of circuit design is increased, but also the circuit area of a TFT device occupied is reduced.

Figure 1:
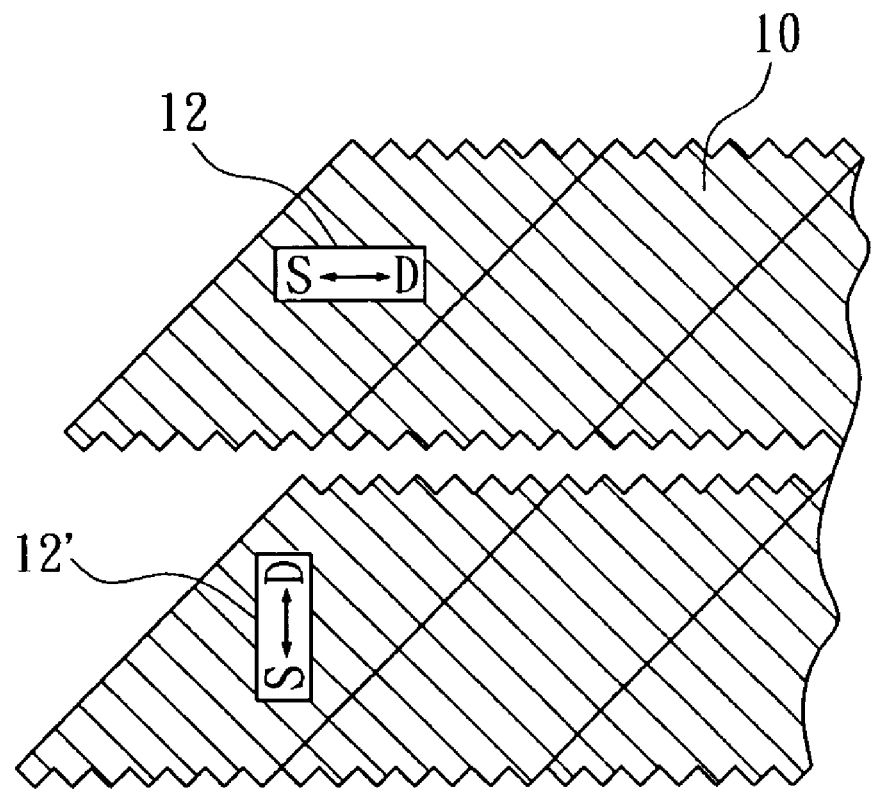
FIG. 1 shows a polycrystalline silicon film disclosed in U.S. Pat. No. 6,521,473
Figure 2A:
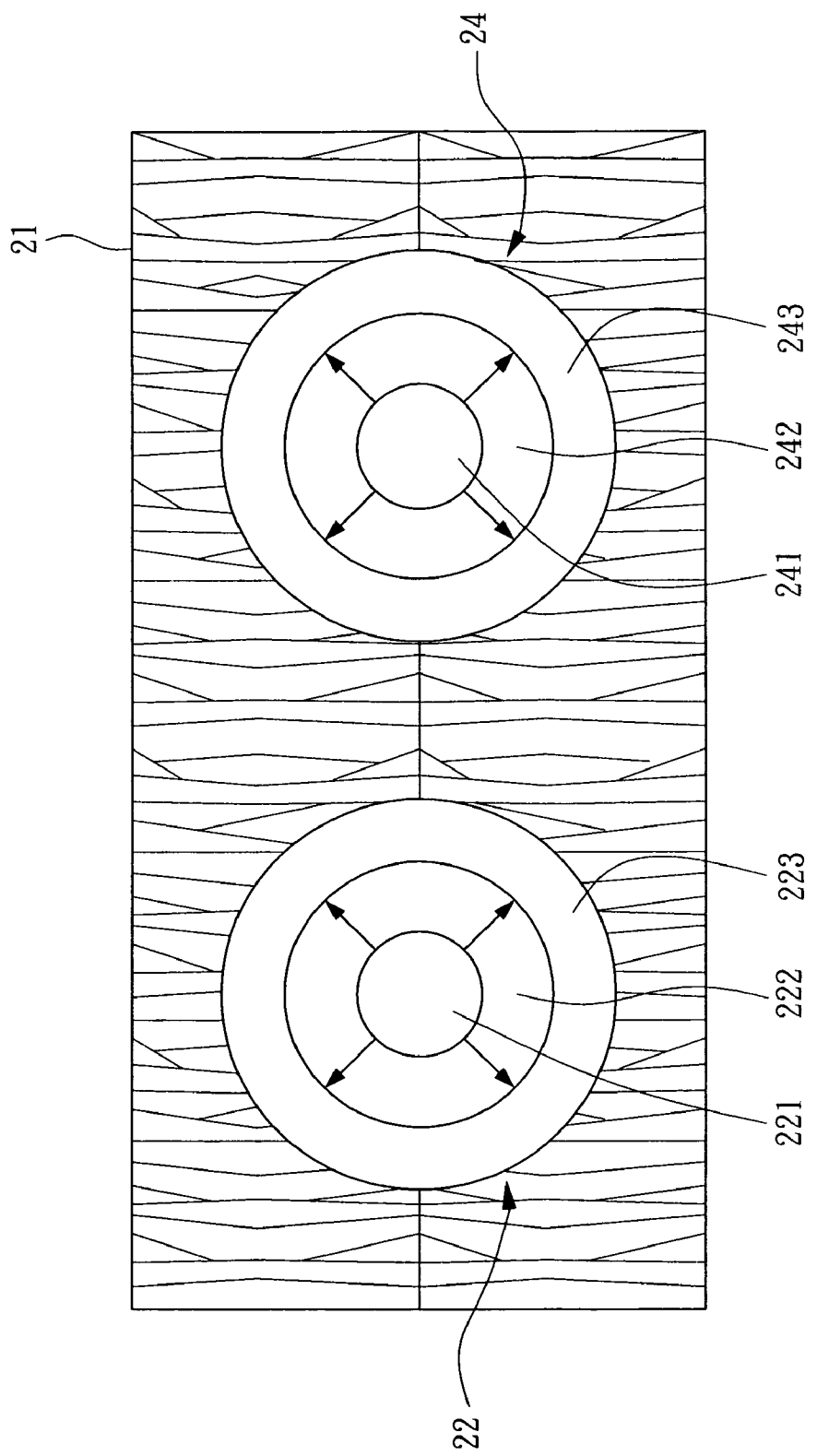
FIG. 2A is a schematic diagram showing a top view of the channel region of a thin film transistor device with high symmetry according to a first preferred embodiment of the invention.

Please refer to FIG. 2A, which is a schematic diagram showing a top view of the channel region of a thin film transistor device with high symmetry according to a first preferred embodiment of the invention. As seen in FIG. 2A, a polycrystalline silicon film 21 of a single crystallization direction is formed on a substrate while forming two concentric-structured transistors 22, 24, i.e. in the transistor 22, a round-shaped drain region 221 is surrounded by an angular-band-shaped channel region 222 while the angular-band-shaped channel region 222 is surrounded by an angular-band-shaped source region 223; and in the transistor 24, a round-shaped drain region 241 is surrounded by an angular-band-shaped channel region 242 while the angular-band-shaped channel region 242 is surrounded by an angular-band-shaped source region 243. As the transistor 22 is enabled, the currents flowing in the channel region 222 are currents irradiated form the drain region 221 to the source region 223 that is also true to the transistor 24 as it is enabled. Thereby, the number of silicon grain boundaries exist on the carrier paths in the two transistors 22, 24 are the same without having to specifically aligned the transistors with respect to the crystallization direction of the polycrystalline silicon film 21, and thus the irregularity of electrical characteristics can be prevented.

Figure 2B:
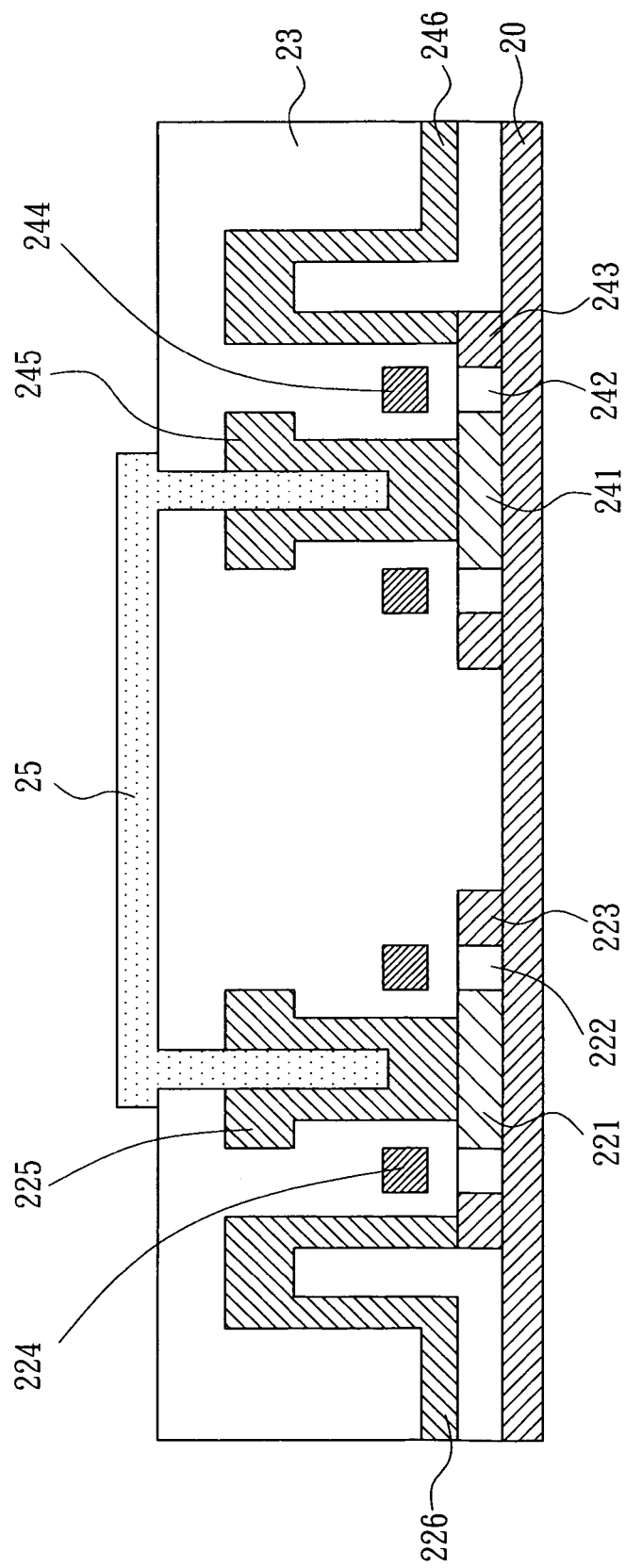
FIG. 2B is a schematic diagram showing the arrangement of the gate and relating conductive wires for the thin film transistor device with high symmetry of the first preferred embodiment of the invention.

Please refer to FIG. 2B, which is a schematic diagram showing the arrangement of the gate and relating conductive wires for the thin film transistor device with high symmetry of the first preferred embodiment of the invention. As seen in FIG. 2B, the two concentric-structured transistors 22, 24 are defined on the polycrystalline silicon film 21 formed on a substrate 21, whereas, in the transistor 22, a round-shaped drain region 221 is surrounded by an angular-band-shaped channel region 222 while the angular-band-shaped channel region 222 is surrounded by an angular-band-shaped source region 223; and in the transistor 24, a round-shaped drain region 241 is surrounded by an angular-band-shaped channel region 242 while the angular-band-shaped channel region 242 is surrounded by an angular-band-shaped source region 243. In addition, two angular-band-shaped gate regions 224, 244 are respectively defined and formed at positions on the insulating layer 23 over the corresponding channel regions 222, 242. As viewing from the top of the TFT device, the two angular-band-shaped gate regions 224, 244 are respectively wrapping an inner electrode, which are the angular-band-shaped channel regions 224, 242. In another word, the transistor is formed by wrapping an inner electrode by a gate. Moreover, an indium tin oxide (ITO) pixel electrode 25 is connected to the two drain regions 221, 241 respectively by the conductive wires 225, 245 while connecting the conductive wires 226, 246 to other transistors, or connecting the transistor 22 to the transistor 24.

Figure 3:
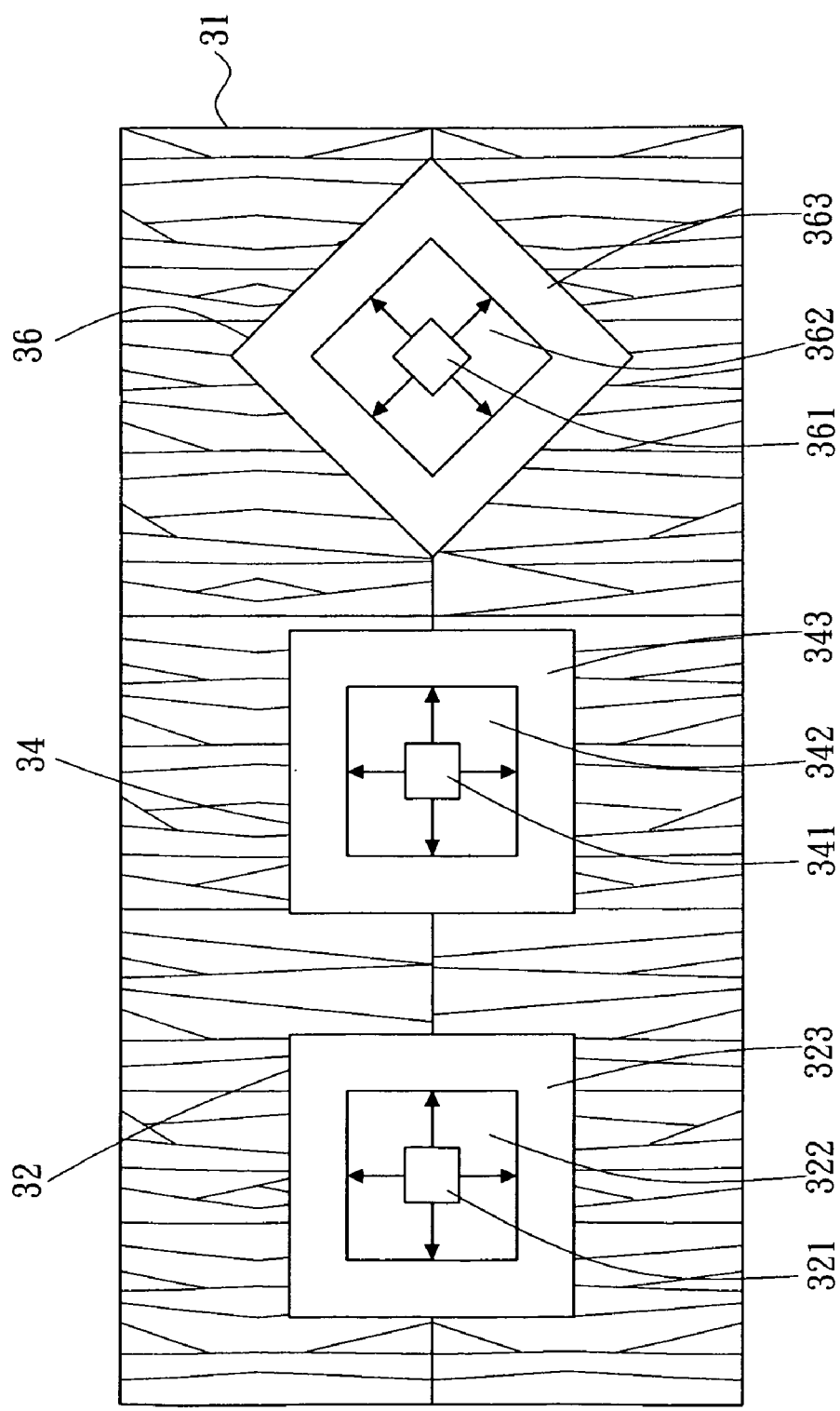
FIG. 3 is a schematic diagram showing a top view of the channel region of a thin film transistor device with high symmetry according to a second preferred embodiment of the invention.

Please refer to FIG. 3, which is a schematic diagram showing a top view of the channel region of a thin film transistor device with high symmetry according to a second preferred embodiment of the invention. As seen in FIG. 3, a polycrystalline silicon film 31 of a single crystallization direction is formed on a substrate while forming three square transistors 32, 34, 36, i.e. in the transistor 32, a square drain region 321 is fitted in a square frame-channel region 322 while the square frame channel region 322 is fitted in a square frame source region 323; and in the transistor 34, a square drain region 341 is fitted by a square frame channel region 342 while the square frame channel region 342 is fitted in a square frame source region 343; moreover, in the transistor 32, a square drain region 361 is fitted in a square frame channel region 362 while the square frame channel region: 362 is fitted in a square frame source region 363. As the transistor 32 is enabled, the currents flowing in the channel region 322 are currents irradiated form the drain region 321 to the source region 323 that is also true to the transistor 34 as it is enabled. Thereby, the number of silicon grain boundaries exist on the carrier paths in the two transistors 32, 34 are the same without having to specifically aligned the transistors with respect to the crystallization direction of the polycrystalline silicon film 31, and thus the irregularity of electrical characteristics can be prevented.

Furthermore, although the orientation of the transistor 36 is rotated by 45 degree with respect to that of the transistor 32, the number of silicon grain boundaries exist on the carrier paths in the channel region 362 of the transistors 36 as the current is flowing from the drain region 361 to the source region 363 are substantially equivalent to that of the channel region 322 of the transistor 32. Thus, the electrical characteristics of the two transistors 32, 36 are almost the same. Therefore, it can be concluded that square transistors with the same area can all present the same electrical characteristics, no matter how they are orientated, so that the irregularity of electrical characteristics can be prevented.

It is noted that transistors of all kinds of regular polygon shapes, such as regular triangle, regular pentagon, and so on, can have similar or even substantially the same electrical characteristics, so that the shape of the transistor can be any right polygon and is not limited by the square as disclosed in FIG. 3.

Figure 4:
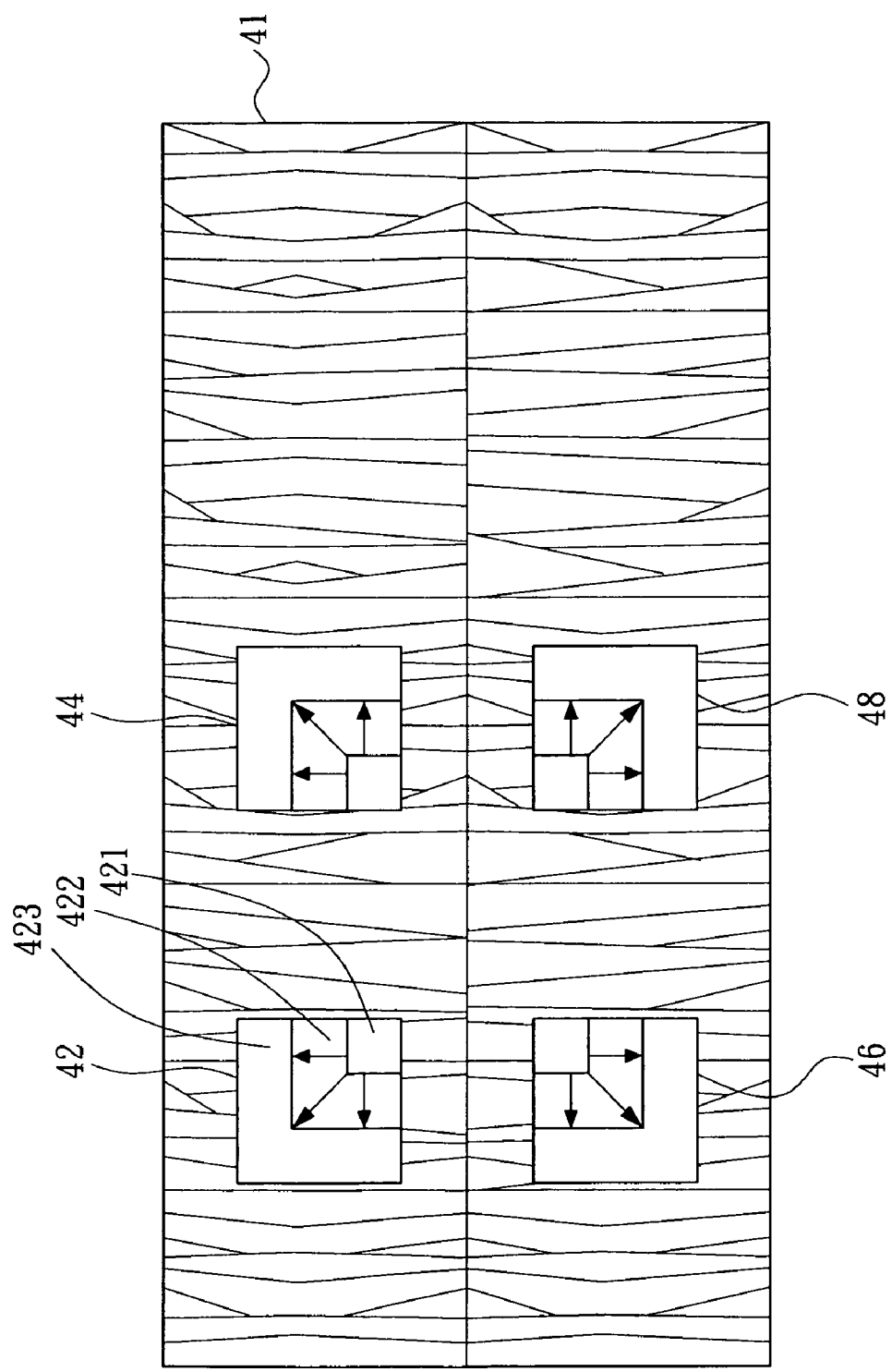
FIG. 4 is a schematic diagram showing a top view of the channel region of a thin film transistor device with high symmetry according to a third preferred embodiment of the invention.

Please refer to FIG. 4, which is a schematic diagram showing a top view of the channel region of a thin film transistor device with high symmetry according to a third preferred embodiment of the invention. As seen in FIG. 4, a polycrystalline silicon film 41 of a single crystallization direction is formed on a substrate while forming four square transistors 42, 44, 46, 48, i.e. in the transistor 42, a square drain region 421 is fitted in the recess corner of a L-shaped channel region 422 while the combined square of the channel region 322 and the drain region 421 is fitted in the recess corner of a L-shaped source region 323; and the transistors 44, 46, 48, are structured similar to that of the transistor 42, but each is oriented at exact 90 degrees difference to the other. As the transistor 42 is enabled, the currents flowing in the channel region 422 are currents irradiated form the drain region 421 to the source region 423 that is also true to the transistors 44, 46, 48 as it is enabled. Thereby, the number of silicon grain boundaries exist on the carrier paths in the transistors 42, 44, 46, 48 are the same without having to specifically aligned the transistors with respect to the crystallization direction of the polycrystalline silicon film 41, and thus the irregularity of electrical characteristics can be prevented. However, if the transistors are not orientated at exact 90 degrees difference to each other as shown in FIG. 4, the irregularity of electrical characteristics can not be prevented.

Figure 5:
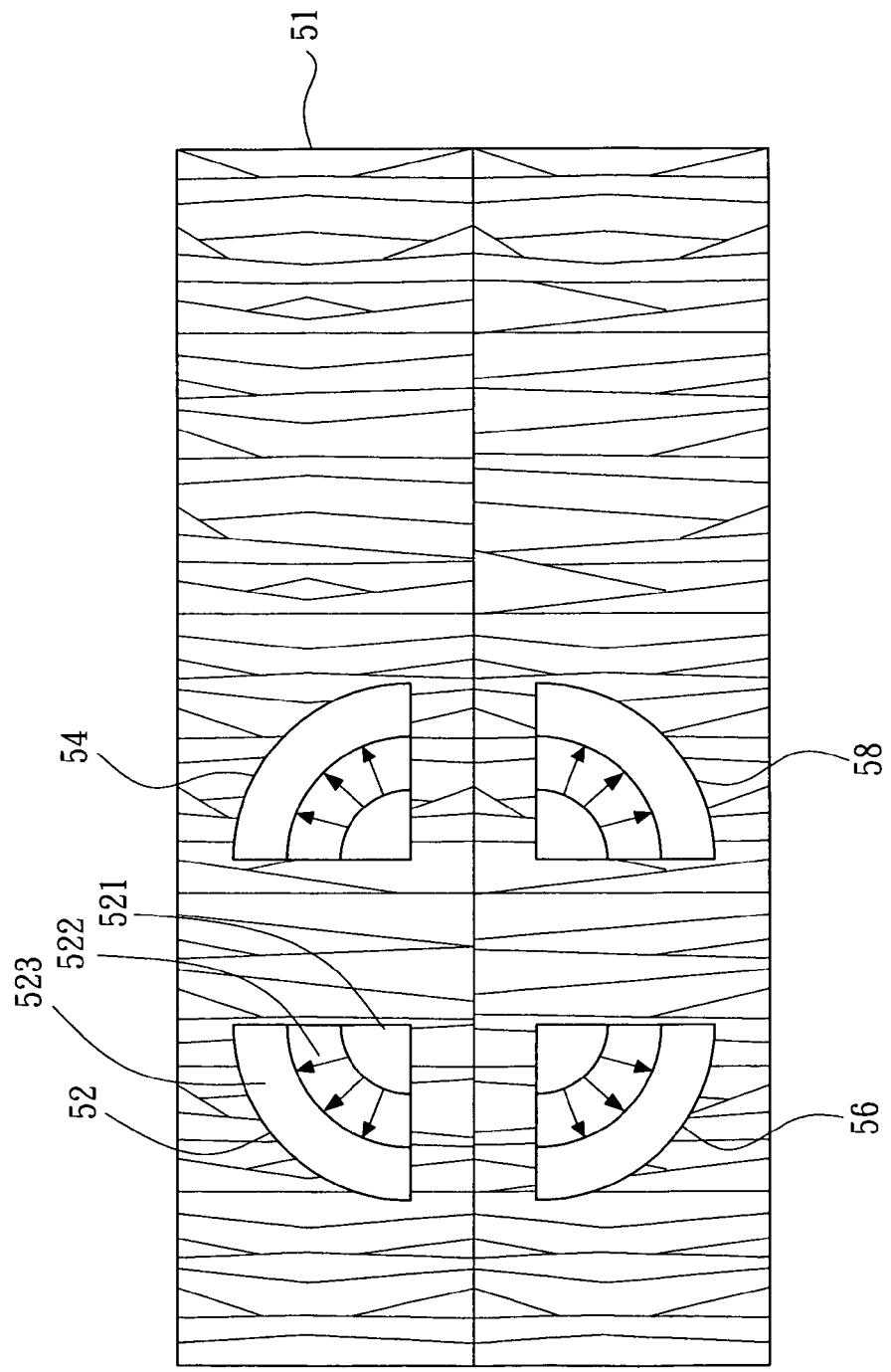
FIG. 5 is a schematic diagram showing a top view of the channel region of a thin film transistor device with high symmetry according to a fourth preferred embodiment of the invention.

Please refer to FIG. 5, which is a schematic diagram showing a top view of the channel region of a thin film transistor device with high symmetry according to a fourth preferred embodiment of the invention. As seen in FIG. 5, a polycrystalline silicon film 51 of a single crystallization direction is formed on a substrate while forming four fan-shaped transistors 52, 54, 56, 58, i.e. in the transistor 52, a fan-shaped drain region 521 is fitted in the concave recess of a quarter annular-band channel region 522 while the combined quarter circle of the channel region 522 and the drain region 521 is fitted in the concave recess of a quarter annular-band source region 523; and the transistors 54, 56, 58, are structured similar to that of the transistor 52, but each is oriented at exact 90 degrees difference to the other. As the transistor 52 is enabled, the currents flowing in the channel region 522 are currents irradiated form the drain region 521 to the source region 523 that is also true to the transistors 54, 56, 58 as it is enabled. Thereby, the number of silicon grain boundaries exist on the carrier paths in the transistors 52, 54, 56, 58 are the same without having to specifically aligned the transistors with respect to the crystallization direction of the polycrystalline silicon film 51, and thus the irregularity of electrical characteristics can be prevented. However, if the transistors are not orientated at exact 90 degrees difference to each other as shown in FIG. 5, the irregularity of electrical characteristics can not be prevented.

It is concluded that as the layout of an interface between the source region and the channel region is the same as that of an interface between the drain region and the channel region, and the pattern of the channel region is a symmetric pattern, the transistors will present the same electrical characteristics as the number of silicon grain boundaries exist on the carrier paths of the channel regions of such transistors are the same. For instance, the pattern of the channel region is symmetric to a line parallel to the crystallization direction; or the pattern of the channel region is symmetric to a line perpendicular to the crystallization direction; or the pattern of the channel region is symmetric to a line on a slant relative to the crystallization direction at an angle of 45 degree.

Furthermore, it is noted that the drain region can be made to be surrounded by the channel region while the channel region is surrounded by the source region; and vice versa, the drain region can be made to be surrounded by the channel region while the channel region is surrounded by the source region. In addition, a lightly doped drain (LDD) can be formed and sandwiched between the channel region and the source region. Similarly, a lightly doped drain (LDD) can be formed and sandwiched between the channel region and the drain region.

To sum up, a thin film transistor device with high symmetry is provided, in which the symmetrical structure of transistor is utilized to enable currents flowing in the channels of each transistor formed on a polysilicon film of a specific crystallization direction to pass the same amount of grain boundaries, thereby improving the uniformity of electrical characteristics of the device. By the thin film transistor device of the invention, not only the freedom of circuit design is increased, but also the circuit area of a TFT device occupied is reduced. The TFT device with high symmetry capable of overcoming the non-uniformity of electrical characteristics can be used as a TFT array of a displaying device, e.g. LCD device.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A thin film transistor device with high symmetry, comprising:
    a substrate;
    a polycrystalline silicon film, formed on the substrate, having a plurality of silicon grains oriented in a specific crystallization direction; and
    a plurality of transistors, each including a source region, a drain region and a channel region formed on the polycrystalline silicon film;
    wherein, the channel region is substantially a symmetric pattern sandwiched between the source region and the drain region for enabling the number of silicon grain boundaries exist on each channel region of the plural transistors for carrier passing to be the same,
    wherein the drain region is surrounded by the channel region while the channel region is surrounded by the source region.

2. The thin film transistor device with high symmetry of claim 1, wherein the polycrystalline silicon film is formed by a sequential lateral solidification (SLS) process.

3. The thin film transistor device with high symmetry of claim 1, wherein the layout of an interface between the source region and the channel region is the same as that of an interface between the drain region and the channel region.

4. The thin film transistor device with high symmetry of claim 1, wherein the pattern of the channel region is symmetric to a line parallel to the crystallization direction.

5. The thin film transistor device with high symmetry of claim 1, wherein the pattern of the channel region is symmetric to a line perpendicular to the crystallization direction.

6. The thin film transistor device with high symmetry of claim 1, wherein the pattern of the channel region is symmetric to a line on a slant relative to the crystallization direction at an angle of 45 degree.

7. The thin film transistor device with high symmetry of claim 1, wherein the channel is formed in a shape of an angular band.

8. The thin film transistor device with high symmetry of claim 1, wherein the channel region is formed in a shape of a regular polygon frame.

9. The thin film transistor device with high symmetry of claim 1, wherein the channel region is a L-shaped region.

10. The thin film transistor device with high symmetry of claim 1, wherein the channel region is formed in a shape of a fan.

11. The thin film transistor device with high symmetry of claim 1, wherein a lightly doped drain (LDD) is formed and sandwiched between the channel region and the source region.

12. The thin film transistor device with high symmetry of claim 1, wherein a lightly doped drain (LDD) is formed and sandwiched between the channel region and the drain region.

13. The thin film transistor device with high symmetry of claim 1, wherein each transistor further comprises a gate region.

14. The thin film transistor device with high symmetry of claim 13, wherein the gate region is formed over the channel region.

15. A thin film transistor device with high symmetry, comprising:
- a substrate;
- a polycrystalline silicon film, formed on the substrate, having a plurality of silicon grains oriented in a specific crystallization direction; and
- a plurality of transistors, each including a source region, a drain region and a channel region formed on the polycrystalline silicon film;
- wherein, the channel region is substantially a symmetric pattern sandwiched between the source region and the drain region for enabling the number of silicon gain boundaries exist on each channel region of the plural transistors for carrier passing to be the same,
- wherein the source region is surrounded by the channel region while the channel region is surrounded by the drain region.

16. The thin film transistor device with high symmetry of claim 15, wherein the polycrystalline silicon film is formed by a sequential lateral solidification (SLS) process.

17. The thin film transistor device with high symmetry of claim 15, wherein the layout of an interface between the source region and the channel region is the same as that of an interface between the drain region and the channel region.

18. The thin film transistor device with high symmetry of claim 15, wherein the pattern of the channel region is symmetric to a line parallel to the crystallization direction.

19. The thin film transistor device with high symmetry of claim 15, wherein the pattern of the channel region is symmetric to a line perpendicular to the crystallization direction.

20. The thin film transistor device with high symmetry of claim 15, wherein the pattern of the channel region is symmetric to a line on a slant relative to the crystallization direction at an angle of 45 degree.

21. The thin film transistor device with high symmetry of claim 15, wherein the channel is formed in a shape of an angular band.

22. The thin film transistor device with high symmetry of claim 15, wherein the channel region is formed in a shape of a regular polygon frame.

23. The thin film transistor device with high symmetry of claim 15, wherein the channel region is a L-shaped region.

24. The thin film transistor device with high symmetry of claim 15, wherein the channel region is formed in a shape of a fan.

25. The thin film transistor device with high symmetry of claim 15, wherein a lightly doped drain (LDD) is formed and sandwiched between the channel region and the source region.

26. The thin film transistor device with high symmetry of claim 15, wherein a lightly doped drain (LDD) is formed and sandwiched between the channel region and the drain region.

27. The thin film transistor device with high symmetry of claim 15, wherein each transistor further comprises a gate region.

28. The thin film transistor device with high symmetry of claim 27, wherein the gate region is formed over the channel region.

* * * * *